(12) United States Patent
Zidan et al.

(10) Patent No.: US 10,340,001 B2
(45) Date of Patent: Jul. 2, 2019

(54) SINGLE-READOUT HIGH-DENSITY MEMRISTOR CROSSBAR

(71) Applicant: KING ABDULLAH UNIVERSITY OF SCIENCE AND TECHNOLOGY, Thuwal (SA)

(72) Inventors: Mohammed Affan Zidan, Thuwal (SA); Hesham Omran, Thuwal (SA); Rawan Naous, Thuwal (SA); Ahmed Sultan Salem, Thuwal (SA); Khaled Nabil Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 15/751,650

(22) PCT Filed: Aug. 23, 2016

(86) PCT No.: PCT/IB2016/055030
§ 371 (c)(1),
(2) Date: Feb. 9, 2018

(87) PCT Pub. No.: WO2017/033129
PCT Pub. Date: Mar. 2, 2017

(65) Prior Publication Data
US 2018/0233196 A1 Aug. 16, 2018

Related U.S. Application Data

(60) Provisional application No. 62/210,571, filed on Aug. 27, 2015.

(51) Int. Cl.
*G11C 13/00* (2006.01)
*H01L 27/24* (2006.01)
*H01L 45/00* (2006.01)

(52) U.S. Cl.
CPC ........ *G11C 13/004* (2013.01); *G11C 13/0033* (2013.01); *H01L 27/2481* (2013.01);
(Continued)

(58) Field of Classification Search
CPC .............................................. G11C 2013/0057
(Continued)

(56) References Cited

U.S. PATENT DOCUMENTS

| 6,317,375 B1 * | 11/2001 | Perner | G11C 7/067 365/189.11 |
| 6,597,598 B1 * | 7/2003 | Tran | G11C 7/062 365/100 |

(Continued)

FOREIGN PATENT DOCUMENTS

| WO | 2016068992 A1 | 5/2016 |
| WO | 2016122627 A1 | 8/2016 |

OTHER PUBLICATIONS

Zidan, M.A., et al.; "Memristor multiport readout: A closed-form solution for sneak paths"; IEEE Transactions on Nanotechnology, vol. 13, No. 2; Mar. 2014; 10 pages.

(Continued)

*Primary Examiner* — Son L Mai
(74) *Attorney, Agent, or Firm* — Patent Portfolio Builders PLLC

(57) ABSTRACT

Methods are provided for mitigating problems caused by sneak-paths current during memory cell access in gateless arrays. Example methods contemplated herein utilize adaptive-threshold readout techniques that utilize the locality and hierarchy properties of the computer memory system to address this sneak-paths problem. The method of the invention is a method for reading a target memory cell located at an intersection of a target row of a gateless array and a target column of the gateless array, the method comprising:

(Continued)

—reading a value of the target memory cell; and—calculating an actual value of the target memory cell based on the read value of the memory cell and a component of the read value caused by sneak path current. Utilizing either an "initial bits" strategy or a "dummy bits" strategy in order to calculate the component of the read value caused by sneak path current, example embodiments significantly reduce the number of memory accesses pixel for an array readout. In addition, these strategies consume an order of magnitude less power in comparison to alternative state-of-the-art readout techniques.

14 Claims, 11 Drawing Sheets

(52) U.S. Cl.
CPC ...... *H01L 45/1206* (2013.01); *G11C 13/0009* (2013.01); *G11C 2013/005* (2013.01); *G11C 2013/0057* (2013.01); *G11C 2213/70* (2013.01)

(58) Field of Classification Search
USPC ........................................................ 365/148
See application file for complete search history.

(56) References Cited

U.S. PATENT DOCUMENTS

| | | | | |
|---|---|---|---|---|
| 6,885,579 | B2 * | 4/2005 | Sakimura | G11C 11/15 365/158 |
| 7,561,461 | B2 * | 7/2009 | Nagai | G11C 7/02 365/148 |
| 8,570,785 | B2 * | 10/2013 | Perner | G11C 5/063 365/148 |
| 8,611,134 | B2 * | 12/2013 | Carter | G11C 13/0002 365/148 |
| 8,837,200 | B2 * | 9/2014 | Tsuji | G11C 13/0004 365/148 |
| 8,953,363 | B2 * | 2/2015 | Shimakawa | G11C 11/1673 365/148 |
| 9,934,849 | B2 * | 4/2018 | Kim | G11C 13/003 |
| 9,934,852 | B2 * | 4/2018 | Kim | G11C 13/0007 |
| 10,049,733 | B2 * | 8/2018 | Muralimanohar | G11C 13/0023 |
| 2002/0126524 | A1 * | 9/2002 | Sugibayashi | G11C 11/16 365/158 |
| 2004/0004856 | A1 | 1/2004 | Sakimura et al. | |
| 2011/0286259 | A1 | 11/2011 | Perner | |
| 2013/0148407 | A1 | 6/2013 | Tsuji et al. | |
| 2017/0271001 | A1 * | 9/2017 | Muralimanohar | G11C 29/50 |

OTHER PUBLICATIONS

Kim, K. H., et al. "A functional hybrid memristor crossbararray/CMOS system for data storage and neuromorphic applications." Nano-letters, vol. 12, No. 1, Dec. 9, 2011; pp. 389-395.

Liang, J. et al. "Effect of wordline/bitline scaling on the performance, energy consumption, and reliability of cross-point memory array." ACM Journal of Emerging Technologies in Computing Systems, vol. 9, Issue 1, Feb. 2013, p. 9.

Vontobel, et al. "Writing to and reading from a nano-scale crossbar memory based on memristors." Nanotechnology, vol. 20, No. 42, Oct. 21, 2009, 21 pages.

Zidan, M. A., et al. "Compensated Readout for High-Density MOS-Gated Memristor Crossbar Array" IEEE Transactions on Nanotechnology, vol. 14, Issue 1, Jan. 2015, 3 pages.

Zidan, M. A., et al. "Memristor-based Memory: The Sneak Paths Problem and Solutions." Microelectronics Journal, vol. 44, Issue 2, Feb. 2013, pp. 176-183.

Zidan, M. A.; "Memristor Circuits and Systems." Thesis by Mohammed Affan Zidan; [retrieved Mar. 20, 2018] Retrieved from the Internet: (dated May 31, 2015), 163 pages.

Zidan, M. A., et al.; "Single-Readout High-Density Memristor Crossbar"; Scientific Reports, vol. 6, No. 7, Jan. 2016; pp. 1-9.

\* cited by examiner

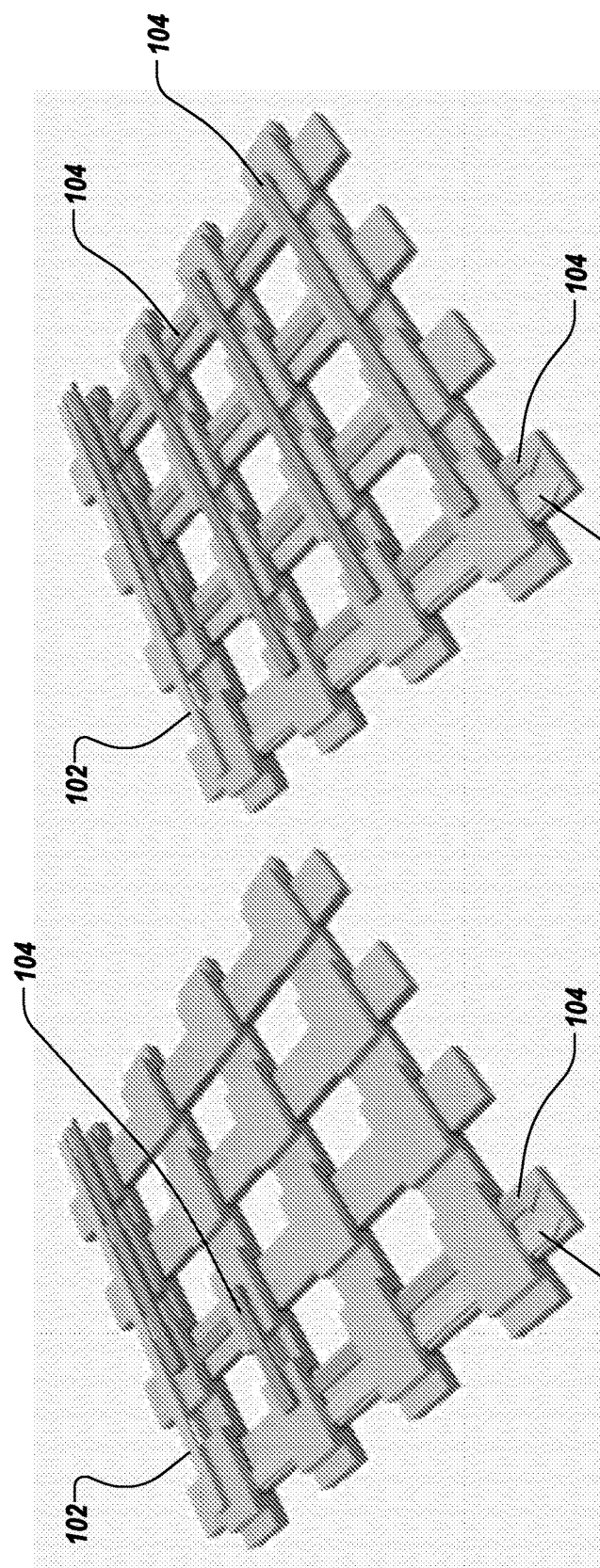

SINGLE-READOUT HIGH-DENSITY MEMRISTOR CROSSBAR

CROSS-REFERENCE TO RELATED APPLICATIONS

The present application is a national phase entry of International Application No. PCT/IB2016/055030, filed Aug. 23, 2016, which claims priority to U.S. Provisional Patent Application No. 62/210,571, filed Aug. 27, 2015. Both of these applications are incorporated herein by reference in their entireties.

TECHNOLOGICAL FIELD

Example embodiments of the present invention relate generally to high-density crossbar memory arrays and, more particularly, to a method and apparatus for mitigating the sneak-paths problem in high-density gateless arrays.

BACKGROUND

Current processor and memory technologies face design challenges that are related to the continuous scaling down of the minimum feature size according to Moore's Law. Moreover, the conventional computing architecture is no longer an effective way to fulfill the demands of modern applications. An exigent need therefore exists to shift to new technologies at both architectural and device levels. Recently, the high-density memristor crossbar architecture attracted attention in this regard. Memristor based resistive RAM is a promising candidate to replace HDD, DRAM, and flash memories. Moreover, the high-density memristive crossbar is also a perfect candidate for neural bio-inspired computing. Such applications are driven by recent advances in the fabrication of memristive devices.

The main advantage of a redox memristive array is its very high density, which entails each memory cell occupying only a few nanometers. The array is simply built as a crossbar structure. This simple assembly is inherently self-aligned and can be fabricated using only one or two lithography masks. While the simplicity of the structure is its principal advantage, it is also the source of its main problem, namely the sneak-paths problem. While accessing the array, current should flow through the desired cell only. However, nothing in the crossbar prevents the current from sneaking through other cells in the array as shown in FIGS. 1A and 1B, which illustrate the desired current path 102 and the sneak-paths 104. This parasitic current ruins the reading and writing operations and adds a considerable amount of undesired power consumption.

The direct solution to the sneak-paths problem is to add a selector (gate) to each memory cell, such as MOS transistors, threshold devices, or complementary memristors. In general, doing so comes at the expense of array density and the complexity of the fabrication process (low cost per bit). As a result, the need arises to address the sneak-paths challenge using the typical gateless crossbar structure in a similar quality of the gated arrays. Several techniques have been proposed for handling such an effect in gateless arrays, including multistage readout, multiport readout, unfolded arrays, engineering device nonlinearity, and grounded array. However, these techniques either require extended accessing time, rely on a power-hungry accessing, reduce the density of the array significantly, or are simply not valid solutions for practical size arrays.

BRIEF SUMMARY

Example embodiments described herein illustrate a single stage readout technique for the high-density gateless resistive arrays. These embodiments reduce the access time to the crossbar array significantly by utilizing the locality property of memory systems and the sneak-paths correlation. The new readout adopts a very power efficient accessing mode to the crossbar, guided by the study of the sneak-paths power consumption presented herein. In addition, minimal control and sensing circuitry are required. Altogether, compared to the traditional solutions described above, these embodiments comprise a faster and more power efficient readout with a simple sensing mechanism.

In a first example embodiment, a method is provided for reading a target memory cell located at an intersection of a target row of a high-density gateless array and a target column of the high-density gateless array. The method includes reading a value of the target memory cell, and calculating an actual value of the target memory cell based on the read value of the memory cell and a component of the read value caused by sneak path current.

In some embodiments, the method calculates the component of the read value caused by sneak path current prior to calculating the actual value of the target memory cell. In this regard, calculating the component of the read value caused by sneak path current may include estimating a value of the initial memory cell, reading a value of the initial memory cell, and calculating the component of the read value caused by sneak path current based on the estimated value of the initial memory cell and a read value of the initial memory cell. In one such instance, for each row in the set, estimating the value of the first memory cell includes reading the value of the first memory cell a plurality of times, and calculating the estimated value of the first memory cell based on reading the value of the first memory cell the plurality of times.

In some embodiments, the method may calculate the component of the read value caused by sneak path current by storing a known value in a dummy memory cell located in the target row, reading a value of the dummy memory cell, and calculating the component of the read value caused by sneak path current based on the known value stored in the dummy memory cell and the read value of the dummy memory cell.

In some embodiments, reading a value of a particular memory cell includes identifying a row of the high-density gateless array and a column of the high-density gateless array that intersect at the particular memory cell, connecting all remaining rows of the high-density gateless array to a first common node, and connecting all remaining columns of the high-density gateless array to a second common node. In some such embodiments, reading the value of the particular memory cell further includes biasing the rows connected to the first common node to a first predefined voltage and the columns connected to the second common node to a second predefined voltage. In this regard, the first predefined voltage and the second predefined voltage may be equal.

In a second example embodiment, an apparatus is provided for reading a target memory cell located at an intersection of a target row of a high-density gateless array and a target column of the high-density gateless array. The apparatus includes a processor and a memory storing computer-executable instructions, that, when executed by the processor, cause the apparatus to read a value of the target memory cell, and calculate an actual value of the target memory cell based on the read value of the memory cell and a component of the read value caused by sneak path current.

In some embodiments, the computer-executable instructions, when executed by the processor, further cause the apparatus to calculate the component of the read value caused by sneak path current prior to calculating the actual value of the target memory cell. In this regard, calculating the component of the read value caused by sneak path current may include estimating a value of the initial memory cell, reading a value of the initial memory cell, and calculating the component of the read value caused by sneak path current based on the estimated value of the initial memory cell and a read value of the initial memory cell. In one such instance, for each row in the set, estimating the value of the first memory cell includes reading the value of the first memory cell a plurality of times, and calculating the estimated value of the first memory cell based on reading the value of the first memory cell the plurality of times.

In some embodiments, the computer-executable instructions, when executed by the processor, further cause the apparatus to calculate the component of the read value caused by sneak path current by storing a known value in a dummy memory cell located in the target row, reading a value of the dummy memory cell, and calculating the component of the read value caused by sneak path current based on the known value stored in the dummy memory cell and the read value of the dummy memory cell.

In some embodiments, reading a value of a particular memory cell includes identifying a row of the high-density gateless array and a column of the high-density gateless array that intersect at the particular memory cell, connecting all remaining rows of the high-density gateless array to a first common node, and connecting all remaining columns of the high-density gateless array to a second common node. In some such embodiments, reading the value of the particular memory cell further includes biasing the rows connected to the first common node to a first predefined voltage and the columns connected to the second common node to a second predefined voltage. In this regard, the first predefined voltage and the second predefined voltage may be equal.

In a third example embodiment, a computer program product is provided for reading a target memory cell located at an intersection of a target row of a high-density gateless array and a target column of the high-density gateless array. The computer program product includes a computer-readable storage medium storing computer-executable instructions that, when executed, cause an apparatus to read a value of the target memory cell, and calculate an actual value of the target memory cell based on the read value of the memory cell and a component of the read value caused by sneak path current.

In some embodiments, the computer-executable instructions, when executed, further cause the apparatus to calculate the component of the read value caused by sneak path current prior to calculating the actual value of the target memory cell. In this regard, calculating the component of the read value caused by sneak path current may include estimating a value of the initial memory cell, reading a value of the initial memory cell, and calculating the component of the read value caused by sneak path current based on the estimated value of the initial memory cell and a read value of the initial memory cell. In one such instance, for each row in the set, estimating the value of the first memory cell includes reading the value of the first memory cell a plurality of times, and calculating the estimated value of the first memory cell based on reading the value of the first memory cell the plurality of times.

In some embodiments, the computer-executable instructions, when executed, further cause the apparatus to calculate the component of the read value caused by sneak path current by storing a known value in a dummy memory cell located in the target row, reading a value of the dummy memory cell, and calculating the component of the read value caused by sneak path current based on the known value stored in the dummy memory cell and the read value of the dummy memory cell.

In some embodiments, reading a value of a particular memory cell includes identifying a row of the high-density gateless array and a column of the high-density gateless array that intersect at the particular memory cell, connecting all remaining rows of the high-density gateless array to a first common node, and connecting all remaining columns of the high-density gateless array to a second common node. In some such embodiments, reading the value of the particular memory cell further includes biasing the rows connected to the first common node to a first predefined voltage and the columns connected to the second common node to a second predefined voltage. In this regard, the first predefined voltage and the second predefined voltage may be equal.

In a fourth example embodiment, an apparatus is provided for reading a target memory cell located at an intersection of a target row of a high-density gateless array and a target column of the high-density gateless array. The apparatus includes means for reading a value of the target memory cell, and means for calculating an actual value of the target memory cell based on the read value of the memory cell and a component of the read value caused by sneak path current.

In some embodiments, the apparatus is configured to calculate the component of the read value caused by sneak path current prior to calculating the actual value of the target memory cell. In this regard, the means for calculating the component of the read value caused by sneak path current may include means for estimating a value of the initial memory cell, means for reading a value of the initial memory cell, and means for calculating the component of the read value caused by sneak path current based on the estimated value of the initial memory cell and a read value of the initial memory cell. In one such instance, for each row in the set, the means for estimating the value of the first memory cell includes means for reading the value of the first memory cell a plurality of times, and means for calculating the estimated value of the first memory cell based on reading the value of the first memory cell the plurality of times.

In some embodiments, the means for calculating the component of the read value caused by sneak path current includes means for storing a known value in a dummy memory cell located in the target row, means for reading a value of the dummy memory cell, and means for calculating the component of the read value caused by sneak path current based on the known value stored in the dummy memory cell and the read value of the dummy memory cell.

In some embodiments, the means for reading a value of a particular memory cell includes means for identifying a row of the high-density gateless array and a column of the high-density gateless array that intersect at the particular memory cell, means for connecting all remaining rows of the high-density gateless array to a first common node, and means for connecting all remaining columns of the high-density gateless array to a second common node. In some such embodiments, the means for reading the value of the particular memory cell further includes means for biasing the rows connected to the first common node to a first predefined voltage and the columns connected to the second common node to a second predefined voltage. In this regard, the first predefined voltage and the second predefined voltage may be equal.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Figure 1C:
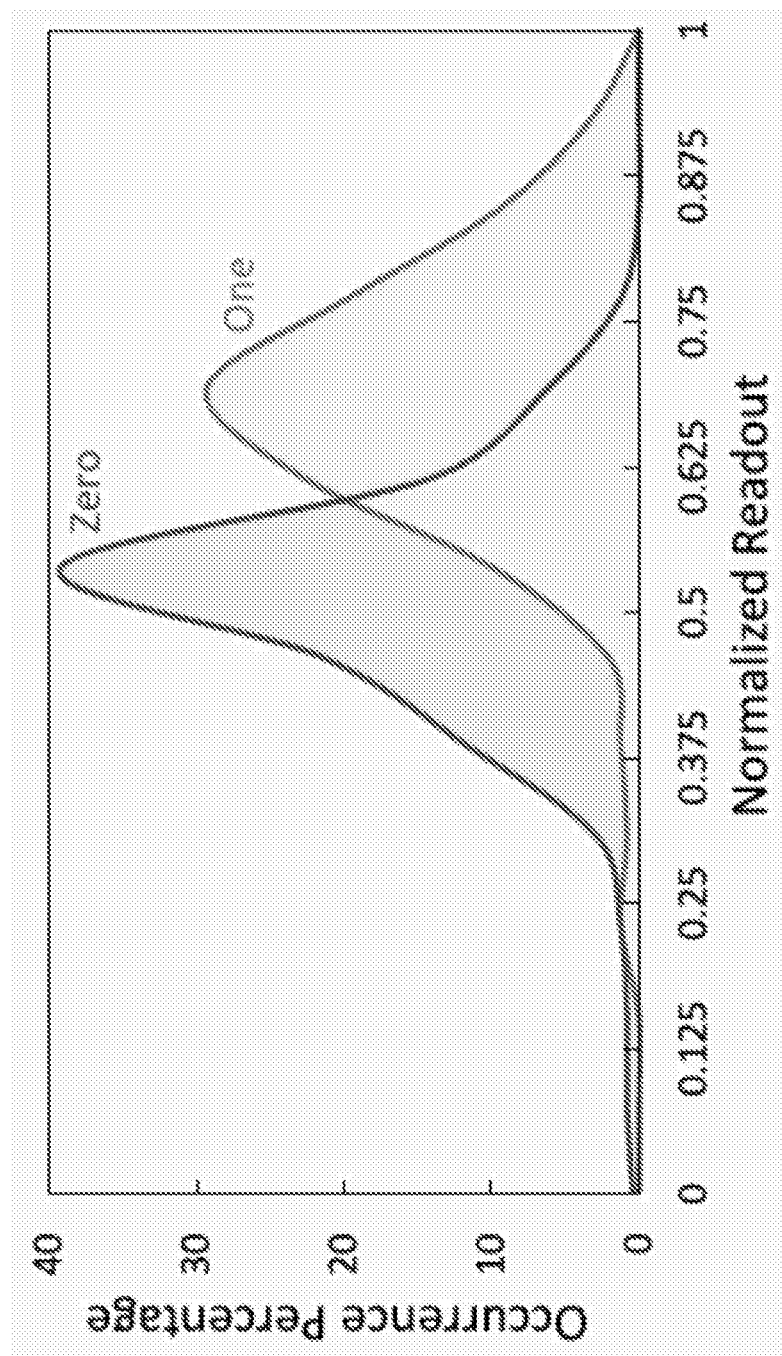
Figure 2B:
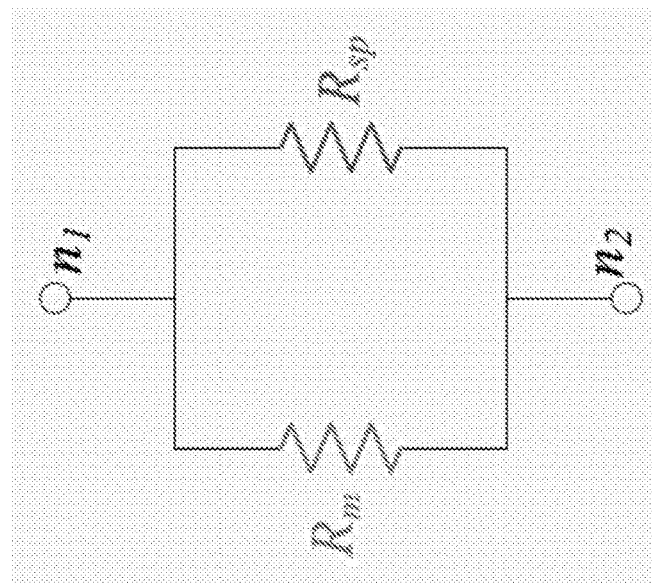
Figure 2A:
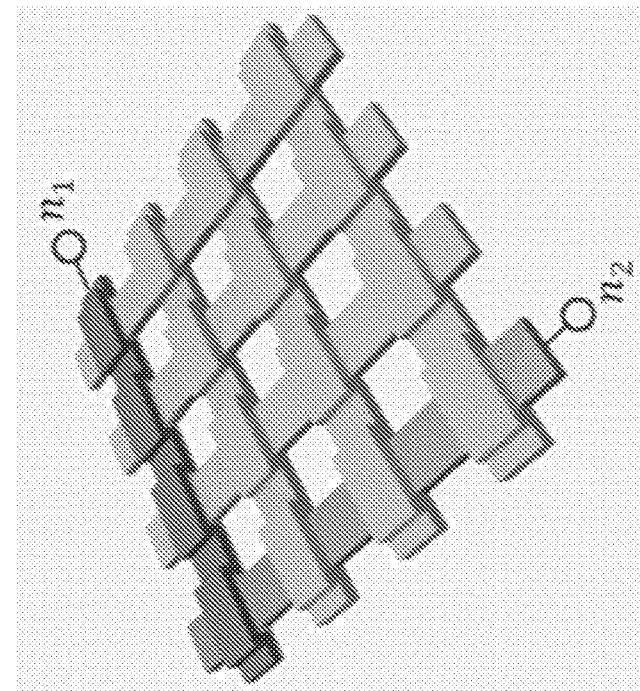
Figure 2D:
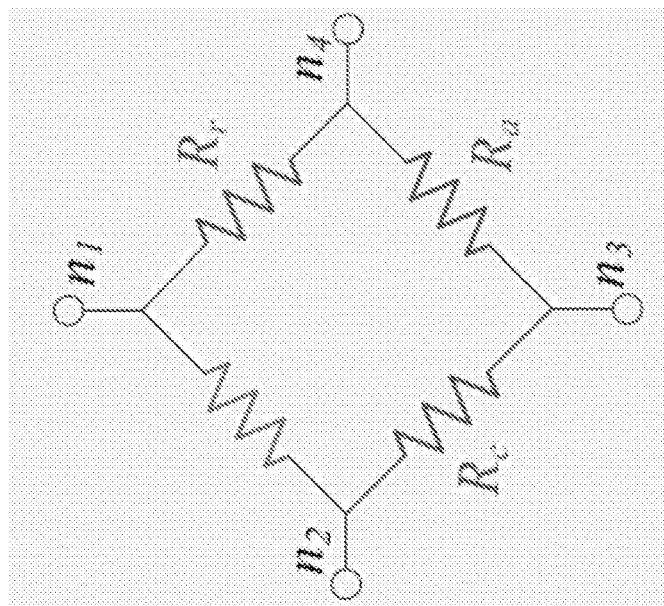
Figure 2C:
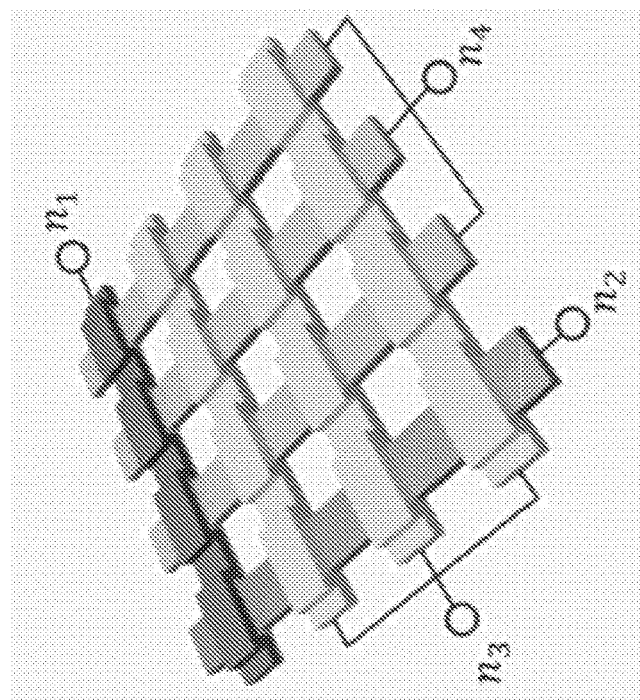
Figure 3A:
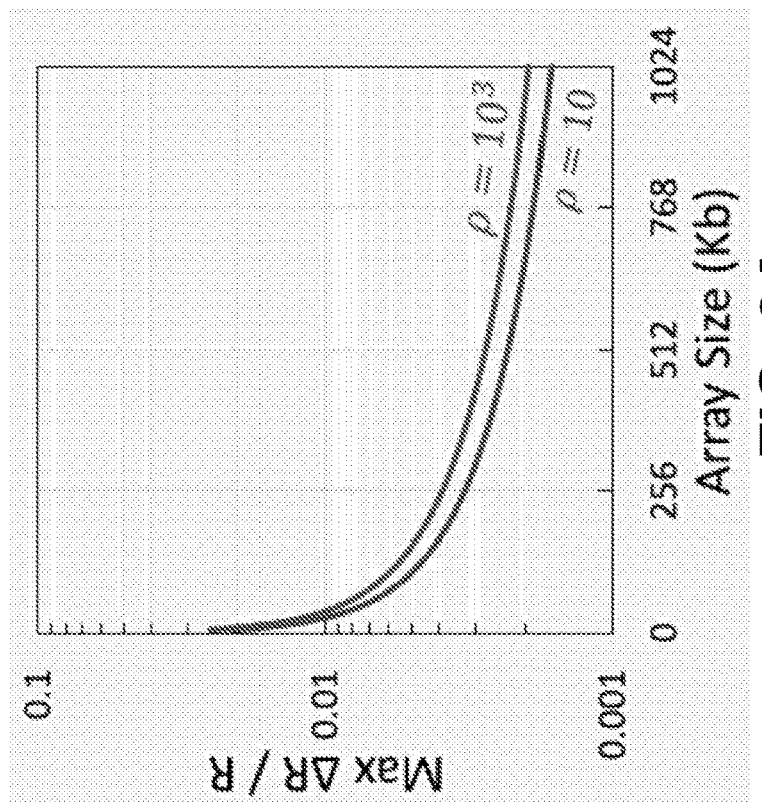
Figure 3B:
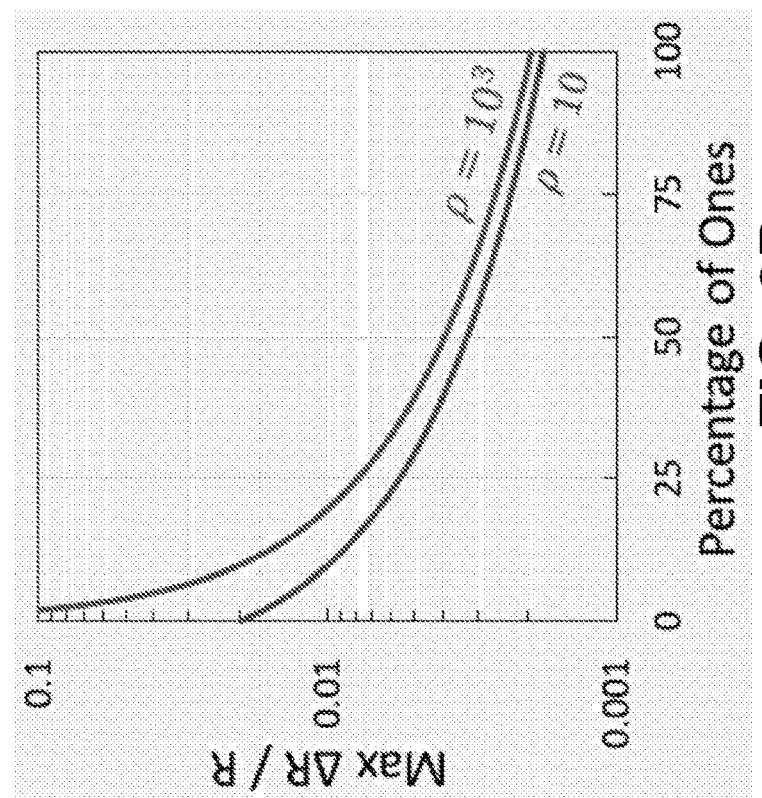
Figures 4A, 4B:
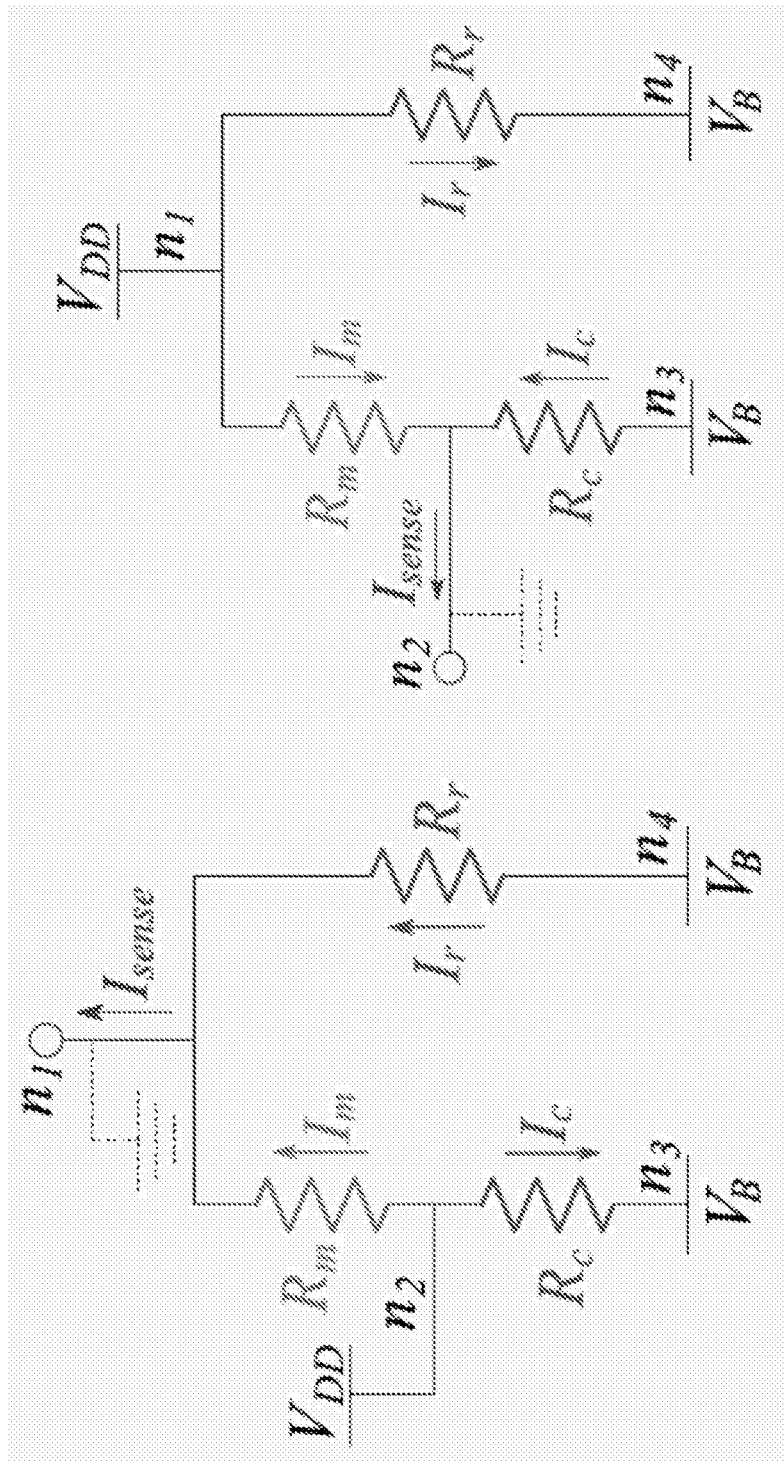
Figures 5A, 5B:
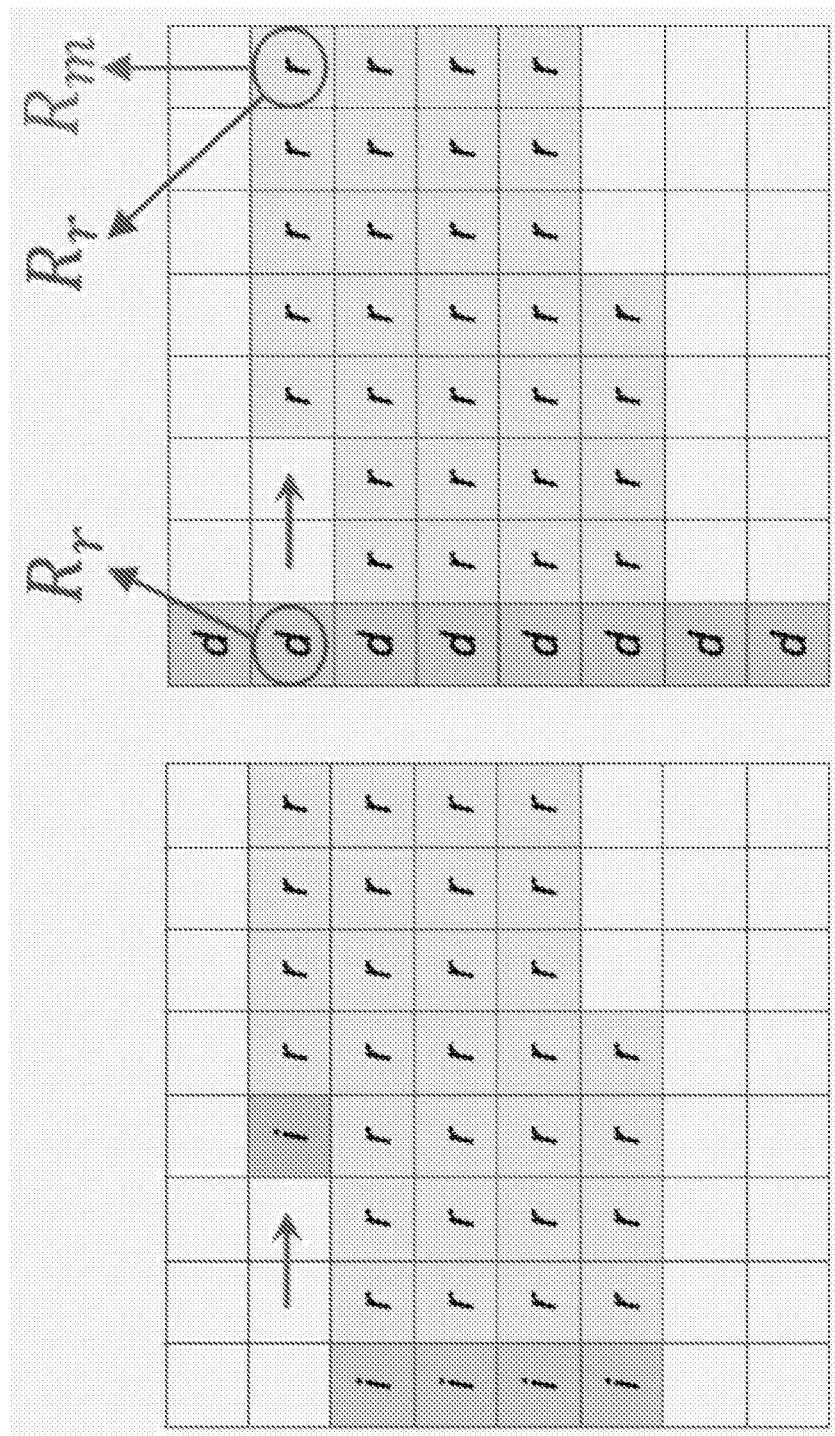
Figures 6A, 6B:
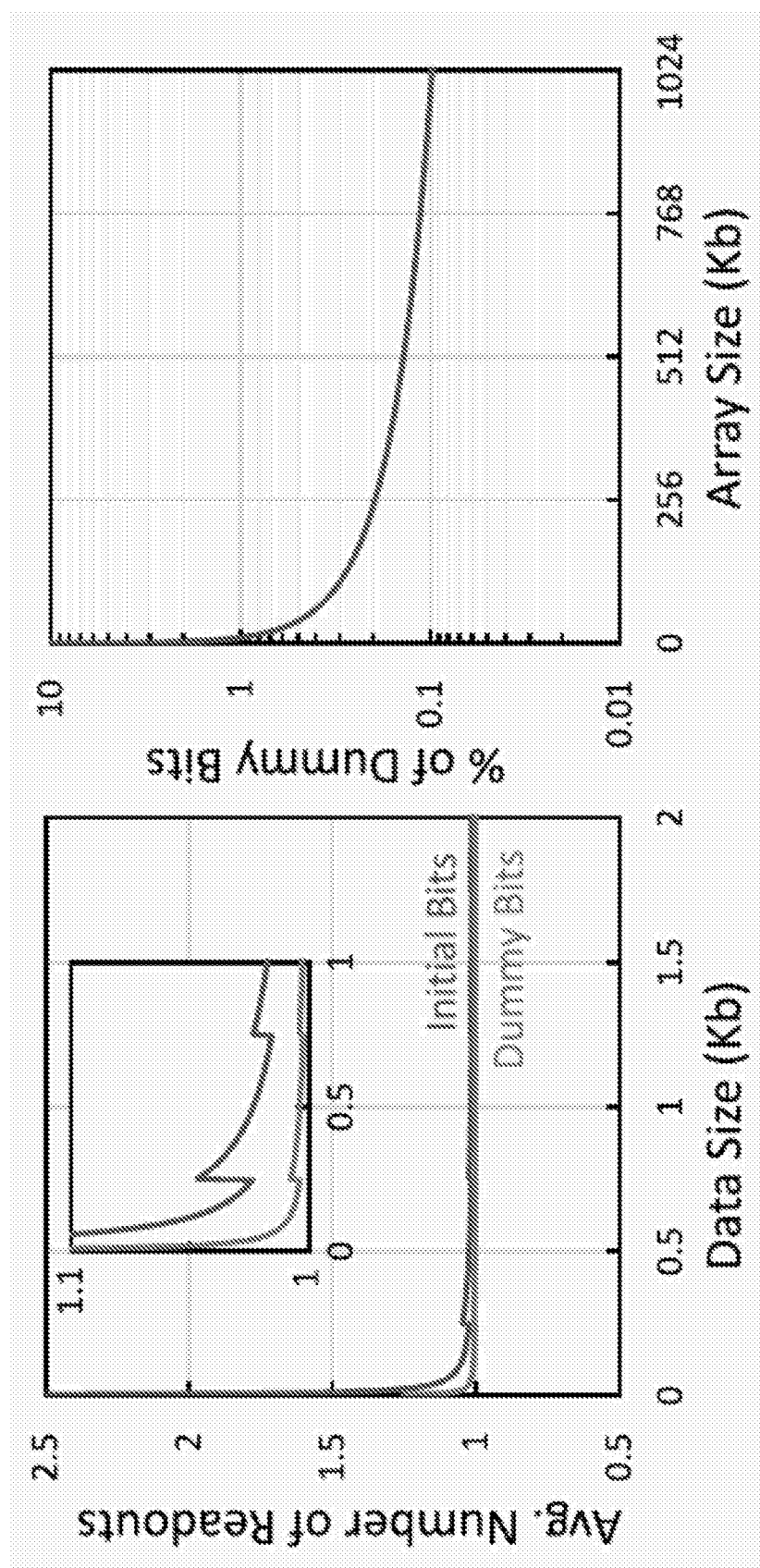
Figure 7:
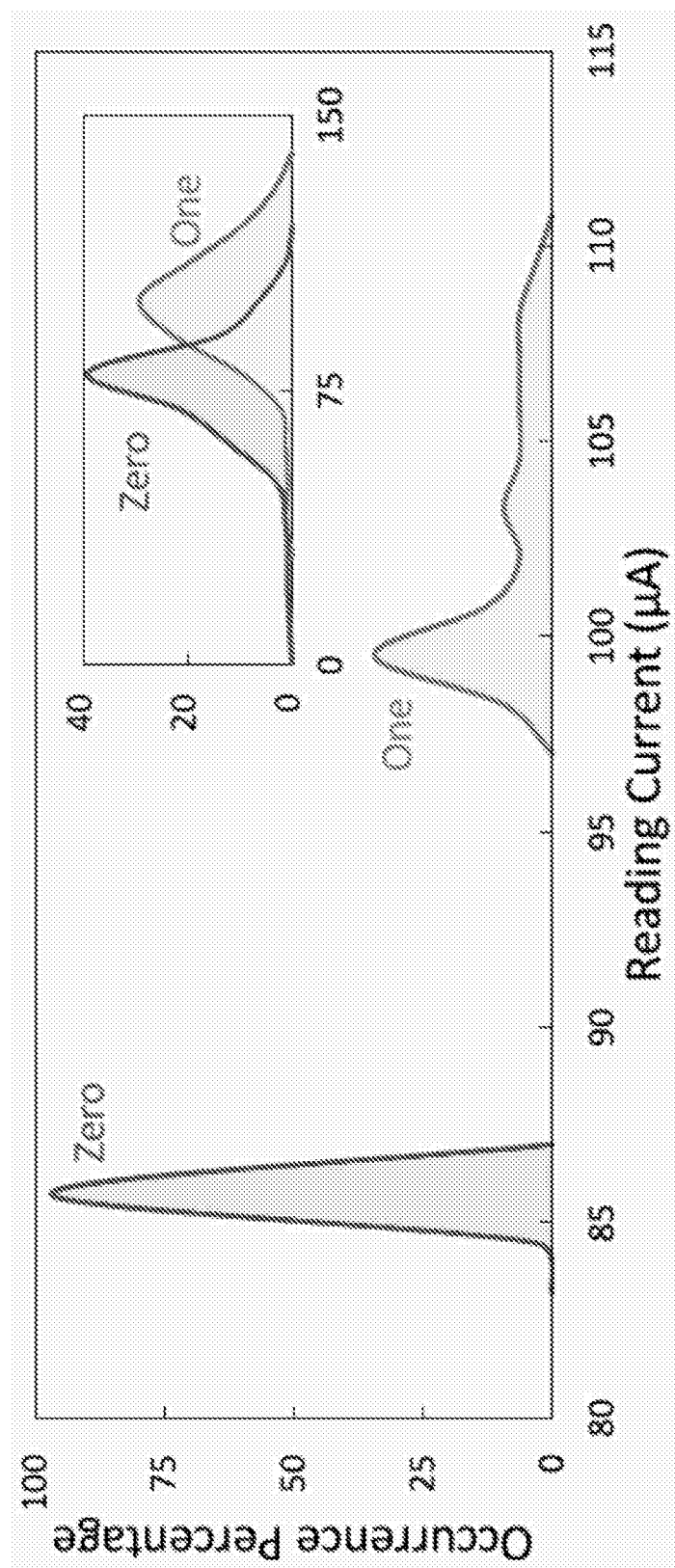
Figures 8A, 8B:
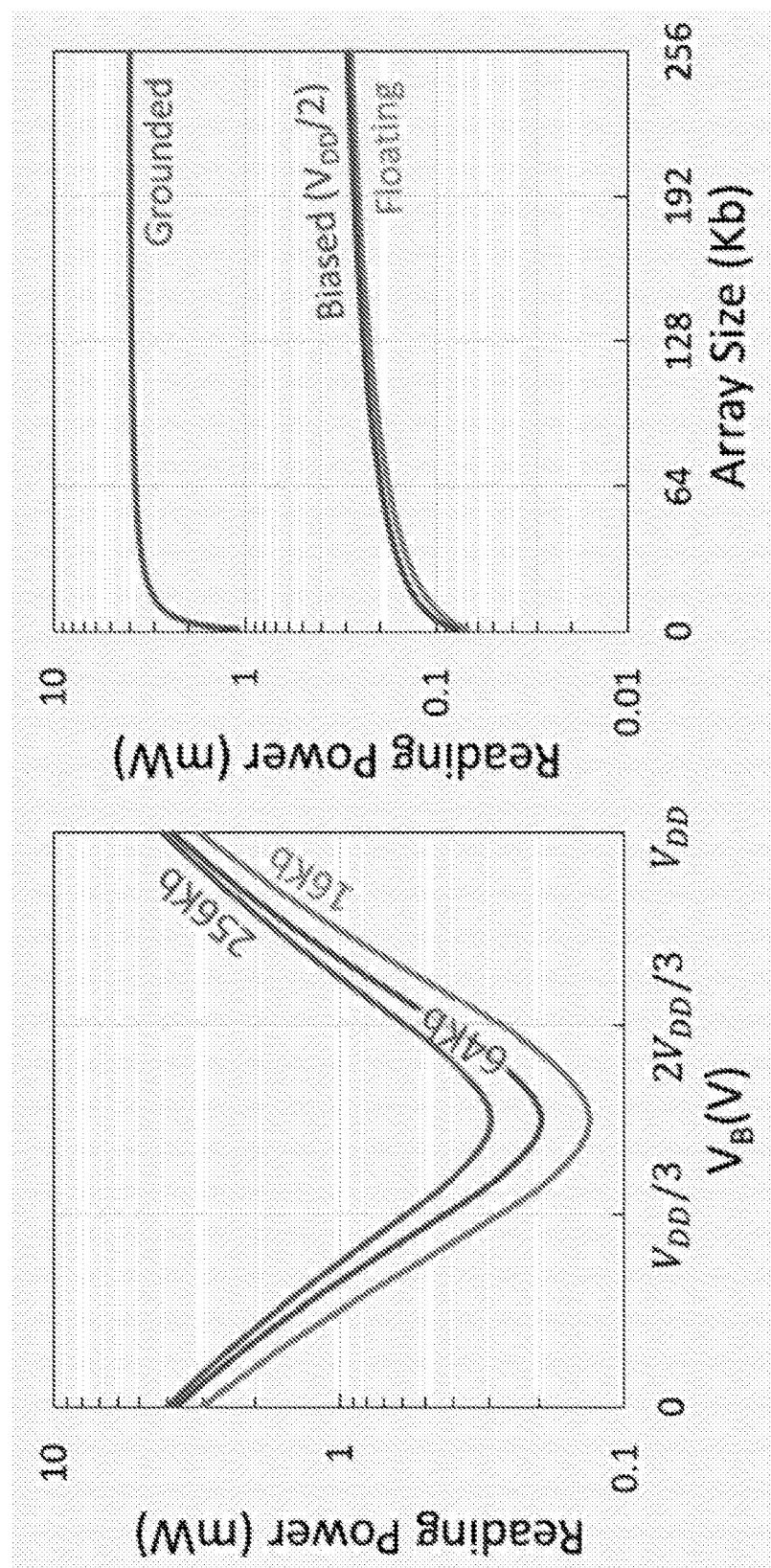
Figure 9:
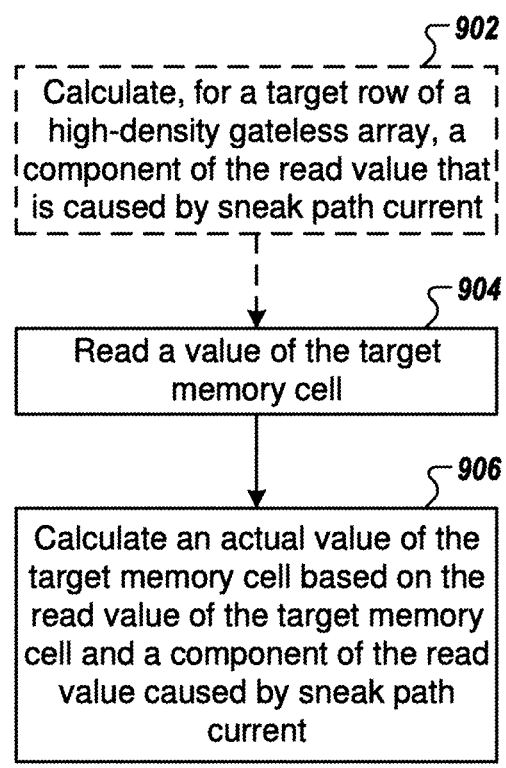

Having thus described certain example embodiments of the present disclosure in general terms, reference will now be made to the accompanying drawings, which are not necessarily drawn to scale, and wherein:

FIGS. 1A and 1B provide diagrams of an example crossbar memristive array that suffers from the sneak-paths problem;

FIG. 1C illustrates a histogram for the "One" and "Zero" values distributions resulting from sneak-paths for a 256 k array filled with NIST RAM images;

FIG. 2A represents a "floating terminals" accessing mode;

FIG. 2B represents an equivalent circuit to the "floating terminals accessing mode;

FIG. 2C represents a "connected terminals" accessing mode, in accordance with some example embodiments described herein;

FIG. 2D represents an equivalent circuit to the "connected terminals" accessing mode, in accordance with some example embodiments described herein;

FIG. 3A shows a graph illustrating the maximum change in resistance related to its original value versus the array size with balanced numbers of "Ones" and "Zeros," in accordance with some example embodiments described herein;

FIG. 3B shows a graph illustrating the maximum change in resistance related to its original value versus percentage of "Ones" for an array of size 256 kb, in accordance with some example embodiments described herein;

FIG. 4A represents an equivalent circuit for the "connected terminals" accessing mode when the row and column terminals are forced to the same voltage and the sense circuit is connected to the desired row, in accordance with some example embodiments described herein;

FIG. 4B represents an equivalent circuit for the "connected terminals" accessing mode when the row and column terminals are forced to the same voltage and the sense circuit is connected to the desired column, in accordance with some example embodiments described herein;

FIG. 5A illustrates an array accessing sequence using an "initial bits" strategy where the initial bit per row/column is accessed 'n' times while the rest of the bits in the same row/column are accessed once, in accordance with some example embodiments described herein;

FIG. 5B illustrates an array accessing sequence using a "dummy bits" strategy where all of the bits of the array are accessed in a single stage fashion, in accordance with example embodiments described herein;

FIG. 6A shows a graph illustrating the average number of readouts versus the fetched data size for the "initial bits" and "dummy bits" adaptive threshold techniques where the first accessed bit is the middle of a row, in accordance with some example embodiments described herein;

FIG. 6B shows a graph illustrating the percentage of "dummy bits" versus the array size, in accordance with some example embodiments described herein;

FIG. 7 shows a histogram for the readout current for reading from a single row using the adaptive threshold techniques, in accordance with some example embodiments described herein, and further shows an "inset" histogram of the same readout without applying the adaptive threshold technique;

FIG. 8A shows a graph illustrating the reading power consumed by a biased-terminals crossbar filled with checkered data pattern versus the array size, in accordance with some example embodiments described herein;

FIG. 8B shows a graph illustrating the reading power consumed by a biased-terminals crossbar filled with checkered data pattern versus the bias voltage, in accordance with some example embodiments described herein; and FIG. 9 illustrates a flow chart including example operations performed by a computing device to generate error-free readouts of a high-density gateless array with an order of magnitude less power consumption than alternative procedures, in accordance with some example embodiments of the present invention.

DETAILED DESCRIPTION

Some embodiments of the present invention will now be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Sneak Paths Analysis

Sneak-paths impact the performance of a crossbar-based system in two ways. First, a considerable amount of undesirable energy is consumed while current sneaks throughout the array cells. Second, the sneak currents cannot be predicted because they are data dependent. Data stored in a memory array is naturally random, which leads to a random sneak-paths resistance. This is translated into having distributions to represent the "One" and "Zero" values rather than a single value. In addition, the magnitude of the sneak-current is typically higher than the current of the desired memory cell; as a result, the distributions for the two binary values are highly overlapped, as shown in FIG. 10. Direct memory readout is therefore not possible, so a power efficient sneak-paths immune readout is a necessity for a functional system.

A crossbar can be accessed using two general modes. The first approach is the "floating terminals" accessing mode, in which the array is accessed through the desired row and column and the other terminals are kept floating, as shown in FIG. 2A. This approach lacks having a solvable equivalent circuit, which is a necessity for effectively dealing with the sneak-paths problem. FIG. 2B shows the array equivalent circuit, where '$R_{sp}$' represents the equivalent resistance of the crossbar sneak-paths, which is dependent on the data stored in the array. The second option is the "connected terminals" accessing mode, in which the unused rows and columns are connected to two common nodes, as shown in FIG. 2C. These nodes could be biased to predefined voltages, or used as extra access points to the array as described in "Memristor Multiport Readout: A Closed-Form Solution for Sneak Paths", IEEE Transactions On Nanotechnology, Vol. 13, No. 2, March 2014. The main strength of the "connected terminals" mode is its equivalent circuit, where the data stored in the array are mapped into three resistances representing the sneak-paths, as shown in FIG. 2D. It should be noted that although the metal line resistances are not included in the equivalent circuit for the sake of simplicity, they are fully considered in the simulations described below.

Sneak-Paths Correlation

An advantage of the "connected terminals" accessing mode is its simple model. In the case of biasing all the unselected terminals at '$V_{DD}=2$', the sneak-paths resistance is made of '$R_r$' and '$R_c$' only, while '$R_a$' is shorted out since nodes '$n_3$' and '$n_4$.' (FIG. 2D) are connected to the same potential level. Hence, only the cells that belong to the desired rows and columns contribute in the sneak-paths, where all of them have a potential drop of '$V_{DD}/2$'. The sneak-paths component due to the accessed row ($R_r$) is a parallel combination of all of the row cells apart from the desired one; it is given by:

$$R_r = \left(\sum_{i=1}^{L-1} \frac{1}{R_{xi}}\right)^{-1}, \tag{1}$$

where '$R_x$' is the resistance of a one-row cell, and 'L' is the array length. The row cell resistance can be either '$R'_{on}$' or '$R'_{off}$', which are the ON and OFF resistance of the device under '$V_{dd}/2$' voltage drop respectively. The row resistance can be rewritten as, $$R_r = \frac{R'_{on}R'_{off}}{(L-1)R'_{on} + N_{on}(R'_{off} - R'_{on})}, \tag{2}$$

where '$N_{on}$' is the number of ON cells within the accessed row not counting the accessed cell itself. The sneak-paths component due to the accessed row ($R_r$) can be derived similarly.

For practical array size, the values of '$R_r$' and '$R_c$' are almost constant over the same row or column, respectively. For instance, the sneak-paths row resistances found at two different locations in the same row have all cells in common except the two cells that are swapped because of the accessed locations. For devices with a large OFF/ON ratio, the relative change in the sneak-paths row resistance is given by:

$$\frac{\Delta R_r}{R_r} \le \left|\frac{\rho}{L + (N_{on}-1)\rho}\right|, \tag{3}$$

where '$\rho$' is the OFF/ON ratio of the used device. The maximum relative change in the row resistance versus the array size for a balanced number of zeros and ones is plotted in FIG. 3A. FIG. 3A shows that as the array size increases the effect of a single bit swap diminishes. The other parameter that affects $\Delta R/R$ is the number of ones (per row or column), as given by equation (3), FIG. 3B shows that the maximum relative change of sneak-paths resistance is still small while the percentage of ones per row/column is swept. As a result, '$R_r$' is almost constant over a given row and '$R_c$' is almost constant over a given column. In this regard, it should be understood that '$\Delta R/R$' represents both '$\Delta R_r/R_r$' and '$\Delta R_c/R_c$' in both FIGS. 3A and 3B.

Adaptive-Threshold Readout

The sneak-paths correlation property can be effectively utilized in case of sequential reading for the stored data on an array, which is the typical memory access scheme in computer systems. The cache fetches a block of data from the RAM, as well as RAM do with the HDD. Data is thus transferred and shared between different memory layers as a block of contiguous bits, rather than in random bits or words. As a result, a memory layer is accessed to read or write blocks of adjacent memory cells in sequence. This is possible because of the data locality property. When a bit location is accessed, its neighborhoods are likely to be accessed too.

The locality property is of help only if the knowledge gained from reading a single bit can be adopted in reading that bit's neighborhoods. This is true for the "connected terminals" crossbar, where the values of '$R_r$' and '$R_c$' can be safely shared over the same row or column respectively, as discussed in the previous sections. This is equivalent to defining an adaptive threshold that changes at each new row readout, which can be achieved with the aid of the "connected terminals" crossbar structure.

The generic "connected terminals" circuit model shown in FIG. 2D can be simplified for the case of '$V_B$' terminal bias. Terminals '$n_3$' and '$n_4$' are connected to '$V_B$', and terminals '$n_1$' and '$n_2$' are connected to '$V_{DD}$' and virtual ground, which can be done using two different implementations as shown in FIGS. 4A and 4B. Using a virtual ground sensing circuit forces all the array elements to have a defined voltage drop independent of the data stored in the array. The desired cell experiences a full '$V_{DD}$' voltage drop, while the sneak-paths components of '$R_r$' and '$R_c$' have only half of this voltage drop. Because of the device saturation nonlinearity, the full voltage drop on the desired cell makes the magnitude difference between its ON and OFF states much larger than any error introduced by sharing '$R_r$' or '$R_c$' over a segment. While both of '$R_r$' and '$R_c$' drain parasitic sneak-current, the current leak through only one of them affects the correctness of the readout operation. When the read circuit is connected to node '$n_1$', as shown in FIG. 4A, the sense current ($I_{sense}$) is defined as:

$$I_{sense} = I_m + I_r, \tag{4}$$

where '$I_m$' is the desired current and '$I_r$' is the row sneak current component. Sensing from node '$n_2$' swaps the locations and the role of '$R_r$' and '$R_c$' in the circuit, as shown in FIG. 4B. The sense current is shifted from its desired value by the sneak-current of the row or the column. However this shift is constant within a given row or column, based on the connection orientation.

Multi-Read for Initial Bits

Each bit generally has two unknowns: '$R_m$' and '$R_r$' (or '$R_c$'). Without adopting sneak-paths correlation and locality, multiple access stages are needed to estimate the bit value. However, a faster readout can be achieved by categorizing the bits into two types: the "initial bits," which are the first bits accessed in a given row, and "regular bits," which are any other bits in the array. To estimate the value of the "initial bit," two unknowns need to be calculated: the desired resistance ($R_m$), and the row sneak resistance ($R_r$). However, the remaining bits in the row share the same ($R_r$) value, and '$I_r$' is treated as a threshold for a given row. Any of the readout techniques presented in the literature, such as Vontobel, P. O. et al., "Writing to and reading from a nano-scale crossbar memory based on memristors," Nanotechnology 20, 425204 (2009), can be used to estimate the "initial bit". For instance, a multistage readout procedure may adopt multiple reads and writes per cell to estimate both of the sneak-paths and the desired current components. The readout for the "initial bit" dictates the threshold used for the remaining bits in that row. In the case of a "Zero" bit, the threshold ($R_{th}$ or $I_{th}$) can be calculated from the readout for the initial bit ($R_{ib}$ or $I_{ib}$) as follows:

$$R_{th}=R_{ib}-C_r, \text{ where } C_r=0.5(R_{off}-R_{on})$$

$$I_{th}=I_{ib}+C_i, \text{ where } C_i=0.5(I_{on}-I_{off})$$

where $R_{on}$ and $R_{off}$ refer to the resistance with and without applying a current to the memory cell, respectively, and similarly where $I_{on}$ and $I_{off}$ refer to the resistance with and without applying a current to the memory cell, respectively.

In the case of a "One" bit, the threshold ($R_{th}$ or $I_{th}$) can be calculated from the readout for the initial bit ($R_{ib}$ or $I_{ib}$) as follows:

$$R_{th}=R_{ib}+C_r, \text{ where } C_r=0.5(R_{off}-R_{on})$$

$$I_{th}=I_{ib}-C_i, \text{ where } C_i=0.5(I_{on}/I_{off})$$

where, as with the "Zero" bit case above, $R_{on}$ and $R_{off}$ refer to the resistance with and without applying a current to the memory cell, respectively, and similarly where $I_{on}$ and $I_{off}$ refer to the resistance with and without applying a current to the memory cell, respectively. Subsequently, the resistance or current of subsequent memory cells can be measured and then compared to this threshold to estimate the actual value of the remaining memory cells in the row.

FIG. 5A shows the readout sequence for the array when this "initial bits" strategy is adopted. Therefore, the first bit (initial bit) could be any bit in the array which requires 'n' stages of reading, and the rest of the bits in the same row are accessed in sequence, only one time for each. Reading from the next row requires a new "initial bit", which in this case is the first bit in the row, as shown in FIG. 5A. The same sequence is followed until the fetched data block for the cache is completed (e.g., each row contains one "initial bit"), and the rest of the bits are accessed in a single stage fashion. It should be noted that in the case of sensing from '$n_1$', data is accessed in a column-wise scheme.

Predefined Dummy Bits

A more time efficient way to estimate the adaptive threshold is to add "dummy bits" with a predefined value to the array. For a dummy bit (which may also referred to as a "predefined bit"), the value of '$R_m$' is known in advance, and a single readout is needed to estimate the value of '$R_r$'. This estimated '$R_r$' value is reused with the other bits in the same row, where, in this case, a single readout is required to estimate the remaining unknown ($R_m$). This value is used for the rest of the bits in the same row. The dummy bit can be organized in several ways, given that each row contains a single bit. FIG. 5B shows a possible organization of dummy bits that is suitable for row-wise readout analogy. It should be understood that in both FIGS. 5A and 5B, 'i' represents an initial bit, 'd' represents a dummy bit, and 'r' represents a regular bit.

In this regard, while accessing a row for the first time during a data block fetching, the threshold ($R_{th}$ or $I_{th}$) can be measured by reading the resistance or current of the dummy (or predefined) bit ($R_{pd}$ or $I_{pd}$). The threshold is defined as, $$R_{th}=R_{pd}-C_r, \text{ where } C_r=0.5(R_{off}-R_{on})$$

$$I_{th}=I_{pd}+C_i, \text{ where } C_i=0.5(I_{on}/I_{off})$$

where $R_{on}$ and $R_{off}$ refer to the resistance with and without applying a current to the memory cell, respectively, and similarly where $I_{on}$ and $I_{off}$ refer to the resistance with and without applying a current to the memory cell, respectively. Subsequently, the resistance or current of subsequent memory cells can be measured and then compared to this threshold to estimate the actual value of the remaining memory cells in the row.

The "dummy bits" technique adds a smaller amount of overhead to the readout process than the "initial bits" method, because a "dummy bit" only needs to be accessed a single time (in comparison to 'n' times for an "initial bit"). However, for practical size arrays with 256 k size or more, the average number of array accesses per bit when fetching a block of data from memory is almost one for both methods. FIG. 6A shows the average number of readouts per memory bit, where the overhead is shared over "regular bits", versus the fetched data size. It also illustrates how the average number of readouts converges to one very fast. The irregularities in the curve occur because that start reading from a new row adds extra overhead for an "initial bit" or a "dummy bit". It should be noted that the typical cache line is 0.5 kb (64 bytes), where multiple lines are fetched from memory in sequence based on the cache policy. This value is much larger in the case of RAM fetching from HDD. While the "dummy bits" technique demonstrates better behavior, it comes at a small expense of the effective area of the array, since "dummy bits" are not used to store real data. This negligible overhead is shown in FIG. 6B.

In order to evaluate the validity and efficiency of crossbar readout techniques, an accurate simulation platform that includes different crossbar non-idealities is a necessity. To achieve this goal, a Python script was utilized that created SPICE netlists for realistic size arrays and swept different parameters and data patterns by calling HSPICE or Cadence APS iteratively. A crossbar parasitic resistance value of 5 Ω per cell was used and the effect of the switching circuitry in all of the simulations was included in this work. Finally, it should be noted that resistive RAMs are built in the same hierarchy and structure of DRAMs, where subarrays of size up to 256 kb are used to reduce the capacitive loading of the metal lines. As a result, the inventors used an array size up to 256 kb for simulations and comparisons with the above-described crossbar readout techniques.

In this regard, to verify the proposed concept, the readout operation was simulated at different locations of a 256 kb array of various NIST RAM images. In a first case, the readout locations were distributed over the array, while in a second, all the readouts were made for cells in the same column. FIG. 7 shows the histogram of the sensed read current in the two cases. The results indicate that normally the distributions of reading "One" and reading "Zero" are highly overlapped, and it is not possible to define a threshold to distinguish between the two binary cases, as shown in FIG. 7 (inset). However, for a given row or column, reading from different locations reveals a clear separation between the distribution of ones and zeros, as shown in FIG. 7. This verifies the merit of the above-described readout schemes, where an adaptive threshold is defined for each column (or row) as discussed earlier. The simulation results show that a simple comparator is able to differentiate between the "One" and "Zero" states.

Crossbar Power Consumption

Undesirable sneak-paths power consumption is not avoidable in high-density gateless arrays. However, it can be reduced by utilizing devices with nonlinear saturation behavior. Reducing the voltage applied to such devices by fifty percent can increase saturation resistance up to two orders of magnitude. This is a very attractive property since a sneak path is made of series memristor devices, where a sub-voltage is dropped on each of them. In the "connected terminals" structure, the device nonlinearity can be enforced by biasing the unused terminals to sub-read voltage. In such case, the very small '$R_a$' is shorted out, and the nonlinearity of the other terminals is efficiently utilized. FIG. 8B shows that, by setting '$V_B$' to '$V_{DD}/2$', the power consumption of this method is almost the same as the baseline "floating terminals". FIG. 8A shows that biasing the unused terminals voltage to be '$V_B=V_{DD}/2$' is the optimal selection. The power consumption of this method is almost the same as the baseline "floating terminals", as shown in FIG. 8B. The figure also shows the great power savings the "connected terminals" technique offers while comparing it with the power hungry "grounded terminals" technique. It should be noted that power consumption saturates for larger array sizes because of the crossbar metal lines.

Figure-of-Merit

In general, the presented technique offers a readout technique that is immune to the sneak-paths problem and that is more power efficient and faster than the state-of-the-art crossbar accessing techniques that are presented in the literature. Table 1 shows a detailed comparison between the various gateless techniques that can provide an error-free readout. The different methods are compared based on a figure-of-merit (FoM), which is defined as $$FoM = \frac{\text{Array Density}}{\text{Readout Power}}, \quad (5)$$

where the proposed technique shows the best FoM.

described herein to perform error-free readouts of a high-density gateless array with an order of magnitude less power consumption than alternative procedures. The operations described in FIG. 9 may be performed by, or under the control of, an apparatus such as a microprocessor, a coprocessor, a controller, a special-purpose integrated circuit such as, for example, an ASIC (application specific integrated circuit), an FPGA (field programmable gate array), DSP (digital signal processor), processing circuitry or other similar hardware.

Turning now to the flowchart, the procedure begins at optional operation 902. In operation 902, the apparatus calculates, for a target row of a high-density gateless array, a component of the read value that is caused by sneak path current.

In some embodiments, calculating this component may utilize the "initial bits" strategy described above. In such embodiments, operation 902 may include arranging the high-density gateless array in a connected terminals structure for accessing an initial memory cell located in the target row. Subsequently, the apparatus may estimate a value of the initial memory cell, and also read a value of the initial memory cell. The apparatus thereafter calculates the component of the read value caused by sneak path current based on the estimated value of the initial memory cell and a read value of the initial memory cell. Furthermore, estimating the value of the first memory cell may include reading the value of the first memory cell a plurality of times, and calculating the estimated value of the first memory cell based on reading the value of the first memory cell the plurality of times. As noted previously, any of the readout techniques presented in the literature can be used to estimate this value.

In other embodiments, calculating the component of the read value that is caused by sneak path current may utilize the "dummy bits" strategy described above. In such embodiments, operation 902 may include storing a known value in a dummy memory cell located in the target row, and arranging the high-density gateless array in a connected terminals structure for accessing the dummy memory cell. Subsequently, the apparatus may read a value of the dummy memory cell, and then calculate the component of the read value caused by sneak path current based on the known value stored in the dummy memory cell and the read value of the dummy memory cell.

It should be understood that operation 902 is optional because, in some embodiments, the component caused by

TABLE 1

Comparison between the state-of-the-art gateless readout techniques for a subarray of size 256 kb.

| | Error Free Readout | # of Reads | # of Writes | Locality Needed | Readout Circuit* | Read Power [mW] | FoM [Tbit/cm²W] |
|---|---|---|---|---|---|---|---|
| Multi-Stage | Yes | 3 | 3 | No | ADC + Comp | 7 | 91 |
| Multi-Port | Yes | 3 | 0 | No | ADC + Comp | 2.1 | 304 |
| Grounded Rows & Cols | No | 1 | 0 | No | VG + Comp | 4 | 160 |
| This Work | Yes | 1.01** | 0 | Yes | VG + Comp | 0.291 | 2195 |

*ADC: Analog-to-Digital Converter, Comp: Comperator, and VG: Virtual-Ground.
**The number of reads is calculated for the case of 16 bytes being fetched from the array in sequence.

Operations Performed by a Computing Device to Efficiently Perform Readout Operations Having stepped through a description of the adaptive threshold techniques used in example embodiments of the present invention, FIG. 9 illustrates a flowchart containing a series of operations performed by example embodiments sneak path current may have been previously calculated and need not be calculated a second time prior to performance of operations 904 through 908.

Turning now to operation 904, the apparatus reads a value of the target memory cell. In this regard, in some embodiments reading a value of a particular memory cell includes identifying a row of the high-density gateless array and a column of the high-density gateless array that intersect at the particular memory cell, and connecting all remaining rows of the high-density gateless array to a first common node; and connecting all remaining columns of the high-density gateless array to a second common node.

Reading the value of the particular memory cell may further include biasing the rows connected to the first common node to a first predefined voltage and the columns connected to the second common node to a second predefined voltage. In this regard, the first predefined voltage and the second predefined voltage may be equal.

Subsequently, in operation 906, the apparatus calculates an actual value of the target memory cell based on the read value of the target memory cell and the component of the read value caused by sneak path current (which may have been calculated in operation 902 or previously stored and simply retrieved for use in operation 908).

For ease of explanation, these operations are described above to retrieve an actual value for a single memory cell. However, it should be understood that these operations may be repeated in sequence for a number of memory cells within a target row to retrieve a series of memory cell values within that target row. Furthermore, if memory cells are desired from other rows of the high-density gateless array, these operations may then be repeated for those other rows. It should also be understood that while these operations contemplate retrieving memory cell values in a row-wise fashion, similar operations may be performed to retrieve a sequence of actual values from memory cells in a column-wise fashion.

Accordingly, as illustrated above, taking advantage of the memory locality and the sneak-paths correlation leads to a fast and power efficient readout technique. Contrary to other techniques, embodiments described herein achieve the theoretical limit of a single memory access per pixel for an array readout at a fraction of the power, when compared to the state-of-the-art readout techniques. In fact, according to the Table 1, the adaptive-threshold readout is 7 to 24 times better than the other gateless techniques presented in the literature, based on the density-power figure-of-merit. In addition, the new sneak-paths immune technique requires minimal hardware to distinguish between the memory data values.

The above-described flowchart in FIG. 9 illustrates operations performed by an apparatus in accordance with some example embodiments of the present invention. It will be understood that each block of the flowchart, and combinations of blocks in the flowchart, may be implemented by various means, such as hardware, firmware, processor, circuitry and/or other device associated with execution one or more computer program instructions. For example, the operations may be performed by one or more of a microprocessor, a coprocessor, a controller, a special-purpose integrated circuit such as, for example, an ASIC (application specific integrated circuit), an FPGA (field programmable gate array), DSP (digital signal processor), processing circuitry or other similar hardware. Blocks of the flowchart support combinations of means for performing the specified functions and combinations of operations for performing the specified functions. It will be understood that one or more blocks of the flowchart, and combinations of blocks in the flowchart, can be implemented by special purpose hardware-based computer systems which perform the specified functions, or combinations of special purpose hardware and computer instructions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for reading a target memory cell located at an intersection of a target row of a high-density gateless array and a target column of the high-density gateless array, the method comprising:
reading a value of the target memory cell;
calculating an actual value of the target memory cell based on the read value of the memory cell and a component of the read value caused by a sneak path current; and
calculating the component of the read value caused by the sneak path current prior to calculating the actual value of the target memory cell,
wherein calculating the component of the read value caused by the sneak path current includes:
estimating a value of an initial memory cell,
reading a value of the initial memory cell, and
calculating the component of the read value caused by the sneak path current based on the estimated value of the initial memory cell and the read value of the initial memory cell.

2. The method of claim 1, wherein, for each row in the set, estimating a value of a first memory cell comprises:
reading the value of the first memory cell a plurality of times; and
calculating the estimated value of the first memory cell based on reading the value of the first memory cell a plurality of times.

3. The method of claim 1, wherein calculating the component of the read value caused by sneak path current comprises:
storing a known value in a dummy memory cell located in the target row;
reading a value of the dummy memory cell; and
calculating the component of the read value caused by sneak path current based on the known value stored in the dummy memory cell and the read value of the dummy memory cell.

4. The method of claim 1, wherein reading a value of a particular memory cell comprises:
identifying a row of the high-density gateless array and a column of the high-density gateless array that intersect at the particular memory cell;
connecting all remaining rows of the high-density gateless array to a first common node; and
connecting all remaining columns of the high-density gateless array to a second common node.

5. The method of claim 4, wherein reading the value of the particular memory cell further comprises:

biasing the rows connected to the first common node to a first predefined voltage and the columns connected to the second common node to a second predefined voltage.

6. The method of claim 5, wherein the first predefined voltage and the second predefined voltage are equal.

7. An apparatus for reading a target memory cell located at an intersection of a target row of a high-density gateless array and a target column of the high-density gateless array, the apparatus comprising a processor and a memory storing computer-executable instructions, that, when executed by the processor, cause the apparatus to:
   read a value of the target memory cell;
   calculate an actual value of the target memory cell based on the read value of the memory cell and a component of the read value caused by a sneak path current; and
   calculate the component of the read value caused by the sneak path current prior to calculating the actual value of the target memory cell,
   wherein the component of the read value caused by the sneak path current is calculated by the apparatus by:
   estimating a value of an initial memory cell,
   reading a value of the initial memory cell, and
   calculating the component of the read value caused by the sneak path current based on the estimated value of the initial memory cell and the read value of the initial memory cell.

8. The apparatus of claim 7, wherein, for each row in the set, estimating a value of a first memory cell comprises:
   reading the value of the first memory cell a plurality of times; and
   calculating the estimated value of the first memory cell based on reading the value of the first memory cell a plurality of times.

9. The apparatus of claim 7, wherein the computer-executable instructions, when executed by the processor, further cause the apparatus to calculate the component of the read value caused by sneak path current by causing the apparatus to:
   store a known value in a dummy memory cell located in the target row;
   read a value of the dummy memory cell; and
   calculate the component of the read value caused by sneak path current based on the known value stored in the dummy memory cell and the read value of the dummy memory cell.

10. The apparatus of claim 7, wherein reading a value of a particular memory cell includes:
   identifying a row of the high-density gateless array and a column of the high-density gateless array that intersect at the particular memory cell;
   connecting all remaining rows of the high-density gateless array to a first common node; and
   connecting all remaining columns of the high-density gateless array to a second common node.

11. The apparatus of claim 10, wherein reading the value of the particular memory cell further includes:
   biasing the rows connected to the first common node to a first predefined voltage and the columns connected to the second common node to a second predefined voltage.

12. The apparatus of claim 11, wherein the first predefined voltage and the second predefined voltage are equal.

13. A computer program product for reading a target memory cell located at an intersection of a target row of a high-density gateless array and a target column of the high-density gateless array, the computer program product comprising a computer-readable storage medium storing computer-executable instructions that, when executed, cause an apparatus to:
   read a value of the target memory cell;
   calculate an actual value of the target memory cell based on the read value of the memory cell and a component of the read value caused by a sneak path current; and
   calculate the component of the read value caused by the sneak path current prior to calculating the actual value of the target memory cell,
   wherein calculating the component of the read value caused by the sneak path current is achieved by causing the apparatus to:
   estimate a value of an initial memory cell,
   read a value of the initial memory cell, and
   calculate the component of the read value caused by the sneak path current based on the estimated value of the initial memory cell and the read value of the initial memory cell.

14. The computer program product of claim 13, wherein the computer-executable instructions, when executed, further cause the apparatus to calculate the component of the read value caused by sneak path current by causing the apparatus to:
   store a known value in a dummy memory cell located in the target row;
   read a value of the dummy memory cell, wherein reading a value of a particular memory cell includes:
   identifying a row of the high-density gateless array and a column of the high-density gateless array that intersect at the particular memory cell,
   connecting all remaining rows of the high-density gateless array to a first common node,
   connecting all remaining columns of the high-density gateless array to a second common node, and
   biasing the rows connected to the first common node and the columns connected to the second common node to a first predefined voltage; and
   calculate the component of the read value caused by sneak path current based on the known value stored in the dummy memory cell and the read value of the dummy memory cell.

* * * * *